United States Patent [19]

Miyagawa et al.

[11] Patent Number: 4,952,478
[45] Date of Patent: Aug. 28, 1990

[54] TRANSFER RECORDING MEDIUM COMPRISING A LAYER CHANGING ITS TRANSFERABILITY WHEN PROVIDED WITH LIGHT AND HEAT

[75] Inventors: Masashi Miyagawa, Kawasaki; Masanori Takenouchi, Atsugi; Norio Ohkuma, Machida, all of Japan

[73] Assignee: Canon Kabushiki Kaisha, Tokyo, Japan

[21] Appl. No.: 127,948

[22] Filed: Dec. 2, 1987

[30] Foreign Application Priority Data

Dec. 2, 1986 [JP] Japan .................................. 61-285860
Dec. 2, 1986 [JP] Japan .................................. 61-285865
Dec. 9, 1986 [JP] Japan .................................. 61-291628

[51] Int. Cl.$^5$ ........................... G03C 1/68; G03C 1/72
[52] U.S. Cl. ..................................... 430/138; 430/253; 430/281; 430/46; 428/195; 428/913; 428/914
[58] Field of Search ............... 430/905, 913, 138, 253, 430/281, 284, 285, 41, 42, 46, 901; 428/195, 913, 914

[56] References Cited

U.S. PATENT DOCUMENTS

| | | | |
|---|---|---|---|
| 3,615,435 | 10/1971 | Chu et al. | 430/253 |
| 3,620,726 | 11/1971 | Chu et al. | 430/291 |
| 3,912,505 | 10/1975 | Goffe et al. | 96/1.2 |
| 4,440,846 | 4/1984 | Sanders et al. | 430/138 |
| 4,542,084 | 9/1985 | Watanabe et al. | 430/46 |
| 4,590,144 | 5/1986 | Schornick et al. | 430/273 |
| 4,590,146 | 5/1986 | Wallbillich | 430/281 |
| 4,632,899 | 12/1986 | Takeda | 430/292 |
| 4,675,269 | 6/1987 | Saccocio et al. | 430/138 |
| 4,701,397 | 10/1987 | Rourke et al. | 430/138 |
| 4,713,312 | 12/1987 | Adair et al. | 430/138 |

FOREIGN PATENT DOCUMENTS 0205083 12/1986 European Pat. Off. ............ 400/120

*Primary Examiner*—Paul R. Michl
*Assistant Examiner*—Patrick A. Doody
*Attorney, Agent, or Firm*—Fitzpatrick, Cella, Harper & Scinto

[57] ABSTRACT

A transfer recording medium comprises a support and a transfer recording layer formed thereon capable of changing its transferability when provided with light energy and heat energy. The transfer recording layer comprises at least a colorant, a binder component an a functional component sensitive to the provision of light energy and heat energy. The functional component comprises at least a photo-initiator and a polymerizing component selected from the group consisting of monomers, oligomers and prepolymers each having an unsaturated double bond. The binder component comprises a thermoplastic polymer having a glass transition temperature of 30° C. or higher and a weight-average molecular weight of $5 \times 10^4$ or larger. The thermoplastic polymer is contained in a proportion of 5–70 wt. % of the transfer recording layer. Because of the inclusion of the polymer binder component, the transfer recording layer has an increased sensitivity contrast to illumination between under heating and under no heating.

11 Claims, 7 Drawing Sheets

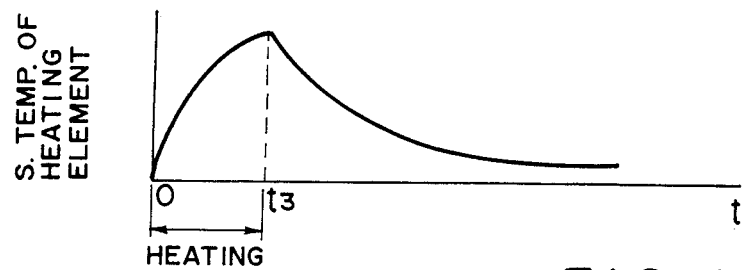
FIG. IA
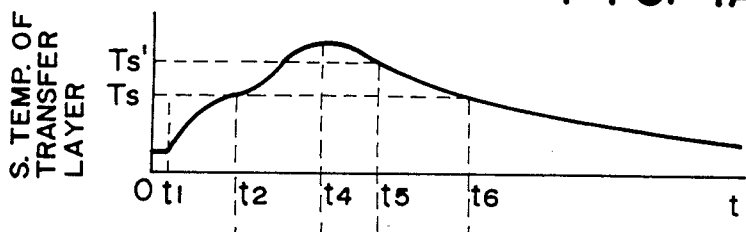
FIG. IB
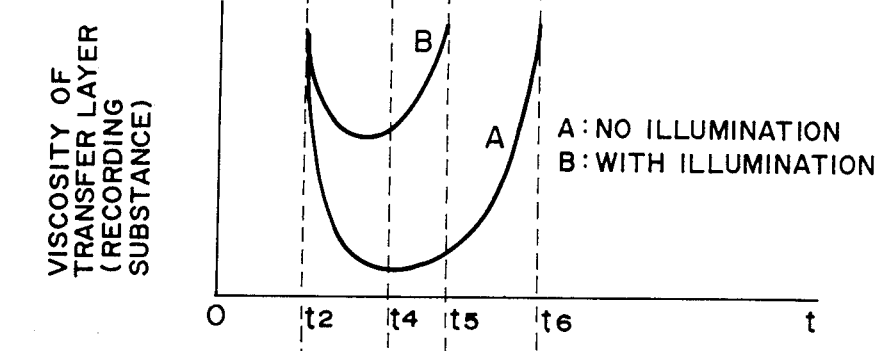
FIG. IC
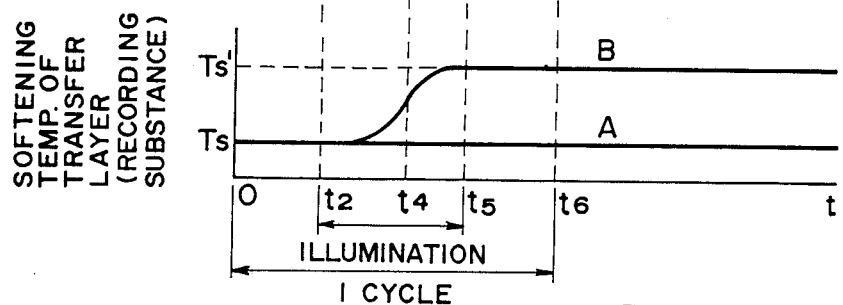
FIG. ID

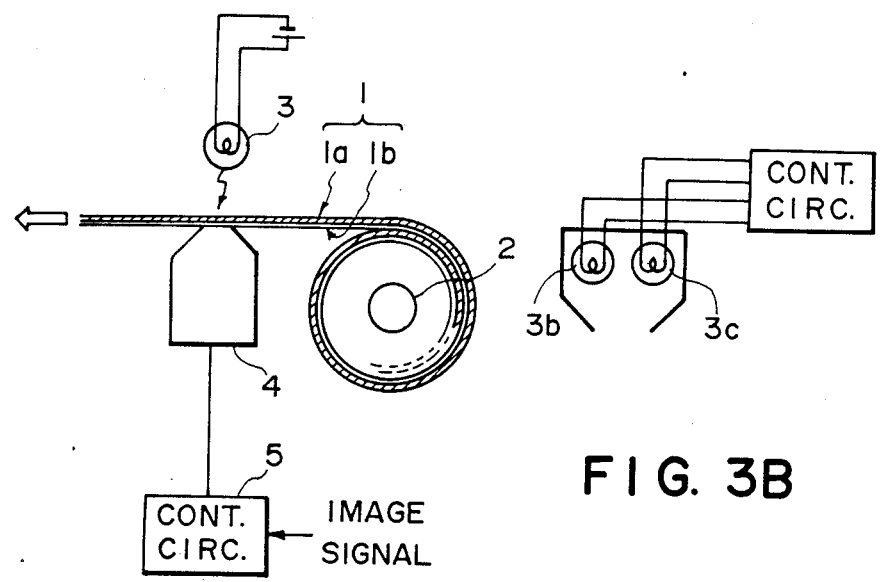
FIG. 3A
FIG. 3B
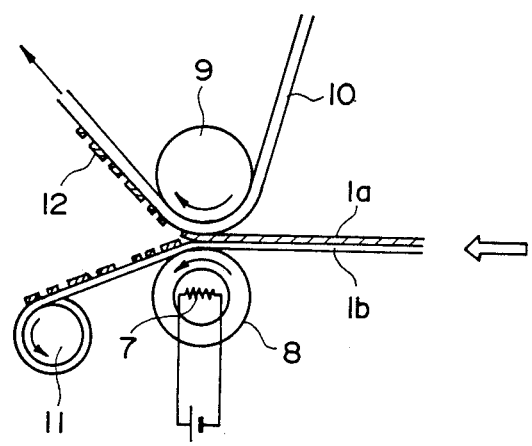
FIG. 4

TRANSFER RECORDING MEDIUM COMPRISING A LAYER CHANGING ITS TRANSFERABILITY WHEN PROVIDED WITH LIGHT AND HEAT

FIELD OF THE INVENTION AND RELATED ART

The present invention relates to a novel transfer recording medium for use in a recording apparatus such as a printer, a copying machine and a facsimile recorder, particularly a recording medium for use in a recording system adapted to one-shot color recording.

In recent years, various recording methods and apparatus adapted for various information processing systems have been developed and adapted. Among these, the thermal transfer recording method has advantages in that the apparatus employed is light weight, compact, free of noise, excellent in operability and adapted to easy maintenance. Accordingly this method has been recently widely used. According to this method, plain paper can be used as a transfer-receiving medium.

However, the heat-sensitive transfer recording method of the prior art is not free from drawbacks. That is, according to the thermal transfer recording method of the prior art, the transfer recording performance, namely the printed letter quality, is strongly influenced by the surface smoothness of the transfer-receiving medium, and therefore while good printing can be effected on a transfer-receiving medium having high smoothness, the printed letter quality will be markedly lower in the case of a transfer-receiving medium with low smoothness. Although paper, which is the most typical transfer-receiving medium, may be used problems are present. A paper with high smoothness is rather special while ordinary papers have surface unevenness to various degrees because they are formed through entanglement of fibers. As a result, according to the conventional thermal transfer recording method, the resulting printed image on paper may not have a sharp edge or a part of the image may be missing thus lowering the printed letter quality.

Further, in the conventional thermal transfer recording method, while the transfer of an ink layer to the transfer-receiving medium is caused by only the heat supplied from a thermal head, it is difficult even from a theoretical point of view to increase the heat supply from the thermal head; that is a problem because it is required to cool the thermal head to a prescribed temperature in a limited short time and it is also necessary to prevent occurrence of thermal crosstalk between heat-generation segments or elements constituting the thermal head face. For this reason, high speed recording has been difficult to realize according to the conventional thermal transfer recording method.

Further, as heat conduction has a slow response speed compared with electricity or light, it has been generally difficult to control a heat pulse sufficient to reproduce a medium tone by the conventional recording system using a transfer medium, and also it has been impossible to effect a medium tone recording as the conventional thermal transfer ink layer lacks a transfer function for gradational representation.

Further, in the conventional thermal transfer recording method, it has been only possible to obtain one image color through one transfer operation, and accordingly, it has been necessary to repeat the transfer step several times to superpose colors in order to obtain a multi-color image. Since is very difficult to exactly superpose images of different colors it has been difficult to obtain an image free of color deviation or aberration. Particularly, when one picture element is involved, superposition of colors has not been effected in such a one-picture element, and consequently, a multi-color image has been constituted by assembly or gathering of picture elements involving color deviation in the conventional thermal transfer recording method. For this reason, it has been impossible to obtain a clear multi-color image according to the conventional thermal transfer recording method.

Further, when it is desired a multi-color image by the conventional thermal transfer recording methods, there have been attendant difficulties such as provision of plural thermal heads or complex movements involving reversals of direction and stopping of a transfer-receiving medium which requires a large and complex apparatus or a decrease in recording speed.

There there has been proposed a transfer imaging method for producing a multicolor image by using a color precursor (chromogenic material) and a developer (U.S. Pat. No. 4,399,209). More specifically, in this method, an imaging sheet comprising a substrate and a coating thereon comprising a chromogenic material and a radiation curable composition encapsulated in rupturable capsules, is provided; the coating is subjected to imagewise exposure with actinic radiation to cure the radiation curable composition and form a latent image and the latent image is superposed onto a developer sheet to form a visible image on the developer sheet.

Further, U.S. Pat. No. 4,416,966 discloses a self-contained image-formation system wherein an imaging sheet comprising a developer and photosensitive microcapsules on the same surface of a support is used. The imaging sheet is exposed to mainly ultraviolet radiation modulated according to recording images, and then passed between pressure rollers where the micro-capsules are ruptured to liberate the enclosed material imagewise. Concurrently, the color former is migrated to contact the developer which is usually contained in a separate layer to cause a reaction to form a color image.

In both of the above two recording systems, only light energy is used for forming a latent image on a transfer recording medium (image sheet), so that a recording medium highly sensitive to light or a light flux of a high energy is required in order to obtain a clear image at a high speed. A high sensitivity recording medium generally has a poor storage stability and is therefore not appropriate for easy handling. Further, it is difficult to obtain a high energy required for curing a radiation-curable composition at a high speed with a single kind of energy, particularly light energy, thus a large apparatus has been generally required.

Further, in the above recording system a color-forming reaction of a leuco dye is utilized so that the resultant recorded image is essentially inferior in stability.

Further, in order to facilitate the development through application of pressure, it is required that the enclosed material in the micro-capsules as such a photosensitive composition is liquid at room temperature and has poor storability. Moreover, the resultant image is accompanied with an odor of a monomer because non-reacted material is ruptured, providing an undesirable characteristic.

In order to solve the above mentioned problems, an image forming method has been proposed (U.S. patent application Ser. No. 869,689 corr. to Japanese patent application No. 128814/1986).

These applications basically disclose an image forming method, comprising: providing a transfer recording medium comprising a transfer recording layer, the transfer recording layer being capable of causing an irreversible change in transfer characteristic thereof when provided with plural kinds of energies; imparting the plural kinds of energies to the transfer recording layer under such a condition that at least one of the plural kinds of energies corresponds to a recording information signal, thereby to form a transferable portion in the transfer recording layer; and transferring the transferable portion of the transfer recording layer to a transfer-receiving medium, thereby to leave an image corresponding to the transferable portion on the transfer-receiving medium.

It has been further proposed a recording method having improved the above image-forming method in respect of the fixability of the recorded image (U.S. patent application Ser. No. 927,876) and a recording method wherein a vaporizable dye is used in the above image-forming method (U.S. patent application Ser. No. 70,194).

SUMMARY OF THE INVENTION

A principal object of the present invention is to provide a recording medium which is suitable for use in the above-mentioned image-forming methods. The invention has solved the problems of the conventional methods as mentioned above, i.e., it can provide transferred images of a high quality, are capable of effecting high-speed recording and medium tone recording and can provide clear multi-color images free of color deviation without accompanying complicated movement of a transfer-receiving medium.

A more specific object of the present invention is to provide a recording medium which is suitable for used in the above-mentioned image-forming methods, which is capable of providing such clear multi-color images free of color deviation at a high sensitivity and at a high transfer rate.

According to the present invention, there is provided a transfer recording medium comprising a support and a transfer recording layer formed thereon capable of changing its transferability when provided with light energy and heat energy;

wherein the transfer recording layer comprises at least a colorant, a binder component and a functional component sensitive to the provision of light energy and heat energy; the functional component comprises at least a photo-initiator and a polymerizing component selected from the group consisting of monomers, oligomers and prepolymers each having an unsaturated double bond; the binder component comprises a thermoplastic polymer having a glass transition temperature of 30° C. or higher and a weight-average molecular weight of $5 \times 10^4$ or larger; and the thermoplastic polymer is contained in a proportion of 5-70 wt.% of the transfer recording layer. Herein, the term "polymerizing" is intended to also cover "crosslinking".

These and other objects, features and advantages of the present invention will become more apparent upon a consideration of the following description of the preferred embodiments of the present invention taken in conjunction with the accompanying drawings, wherein like parts are denoted by like reference numerals. "Parts" or "%" used hereinafter with reference to a composition are by weight unless otherwise noted specifically.

BRIEF DESCRIPTION OF THE DRAWINGS

FIGS. 1A-1B show charges of several parameters with elapse of time involved in an image forming step using a transfer recording medium according to the present invention;

FIGS. 3A, 3B and 4 are schematic views showing embodiments of apparatus for using a transfer recording medium of the invention;

DETAILED DESCRIPTION OF THE INVENTION

Figure 2A:
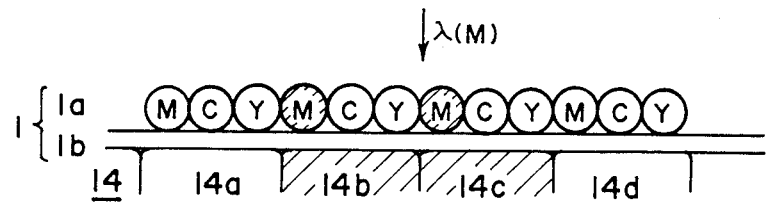
FIGS. 2A-2D are schematic partial sectional views showing a relationship between a transfer recording medium and a thermal head involved in a multi-color transfer recording mode using a transfer recording medium according to the present invention.

The transfer recording medium according to the present invention comprises a support and a transfer recording layer disposed on the support. The transfer recording layer contains a functional component sensitive to provision of light energy and heat energy and is composed to change its transfer characteristic when provided with light energy and heat energy. The transfer recording layer may be a continuous uniform layer or may be a distributed layer of image forming elements. The image forming elements can be in the form of microcapsules.

In order to effect recording, light and heat energies are supplied to the transfer recording layer so that at least one of them corresponds to given recording information to provide portions having different transfer characteristics, whereby a transferable image based on a difference in transfer characteristic is formed and transferred to a transfer receiving medium.

The physical property controlling the transfer characteristic may be determined depending on a particular type of transfer recording medium used. For example, with respect to a transfer recording medium used in a transfer mode wherein transfer of an image is effected through heat-fusion of the image, the physical property may be a melting temperature, a softening temperature, a glass transition temperature, etc. With respect to a transfer recording medium used in a transfer mode wherein transfer of image is effected by making a transferable image viscous or penetrable into a transfer-receiving medium, the physical property may be a viscosity at the relevant temperature.

An image forming method suitable for using the recording medium of the present invention for image formation is explained with reference to FIGS. 1A–1D, wherein the abscissas are indicated on a common scale of time. The transfer recording layer contains a photoinitiator, a polymerizing component, etc., which will be explained hereinafter. FIG. 1A shows a surface temperature change of a heating element when a heating means such as a thermal head is energized for heat generation for a period of $0–t_3$ and subjected to temperature decrease thereafter. A transfer recording medium contacting the heating means under pressure causes a temperature change as shown in FIG. 1B corresponding to the temperature change of the heating means. More specifically, it starts to cause a temperature rise after a time delay of $t_1$ and similarly reaches the maximum temperature at time $t_4$ after time $t_3$, then followed by temperature decrease. The transfer recording layer has a softening temperature Ts and the viscosity thereof decreases in a temperature region above Ts. The change in viscosity is shown by a curve A in FIG. 1C. Thus, after the temperature reaches Ts at time $t_2$ and until it reaches the maximum temperature at time $t_4$, the viscosity continually decreases, while the viscosity again increases thereafter along with temperature decrease to show an abrupt increase in viscosity until time $t_6$ when the temperature decreases to Ts. In this case, the transfer recording layer has not been basically subjected to any material change and shows a decrease in viscosity in the manner as described above when it is heated above Ts in a subsequent transfer step.

Accordingly, if the transfer recording layer is caused to contact a transfer-receiving medium under pressure and subjected to heating required for transfer, e.g., to a temperature above Ts, the transfer recording layer is transferred in the same transfer mechanism as involved in the conventional thermal transfer recording. In this invention, however, when the transfer recording layer is illuminated or exposed to light from $t_2$ in parallel with heating as shown in FIG. 1D, and the temperature is sufficiently increased, the transfer recording layer softens and the reaction initiator, is actuated to provide a large reaction velocity, and a composition comprising at least one of a monomer, oligomer or prepolymer having an ethylenically unsaturated double bond rapidly causes hardening because of increased probability of polymerization.

The heated temperature may preferably be set to 70° C. or more, particularly 80° C. or more in order to provide a good result through rapid and stable reaction of changing the transfer characteristic.

If heating and illumination are simultaneously carried out in this way, the transfer recording layer shows a viscosity change as represented by a curve B in FIG. 1C. Then, along with further progress of curing, the softening temperature is raised from Ts to Ts' at time $t_2$ when the curing is completed. Corresponding to this, the transfer recording layer is caused to have a different transfer initiation temperature, i.e., a temperature at which it starts to be transferred, from a certain temperature Ta to Ta'. The change in softening temperature as described above of the transfer recording layer is illustrated in FIG. 1D. As a result, the transfer recording layer has a portion having a transfer initiation temperature Ta' and also a portion retaining a transfer initiation temperature Ta which behave differently in a subsequent transfer step. Now, when the transfer recording layer is heated to a temperature Tr satisfying $Ta < Tr < Ta'$, the portion having a transfer initiation temperature Ta preferentially causes an abrupt decrease in viscosity to be selectively transferred to a transfer-receiving medium. In this instance, $Ta' - Ta$ should preferably be about 20° C. or more, particularly 40° C. or more, while it somewhat depends on temperature stabilization accuracy during the transfer step. The value also holds true with a case of $Ts > Ts'$. In this way, a transferable image may be formed by controlling heating or non-heating in combination with simultaneous illumination, corresponding to an image signal.

The physical property controlling the transfer characteristic of the transfer recording layer may be a melting point or glass transition point in addition to the above-mentioned softening temperature. In any case, a transferable image is formed in the transfer recording layer through utilization of an irreversible change in physical property such as melting point and glass transition temperature. The softening temperature, melting temperature and glass transition temperature change with similar tendencies, so that the above explanation with respect to utilization of the softening temperature may also be an explanation with respect to utilization of a melting point or glass transition point.

As will be understood from the above description, the degree of irreversible change in transfer characteristic required for the transfer recording layer in the present invention is conveniently represented by a change in transfer initiation temperature. Herein, the transfer initiation temperature mentioned herein is a value measured by the following method.

A 6 $\mu$-thick transfer recording layer formed on a 6 $\mu$-thick polyethylene terephthalate (PET) film is caused to contact 0.2 mm-thick wood-free paper as a transfer-receiving medium having a surface smoothness (Bekk smoothness) of 50–200 seconds. The resultant laminate of the transfer recording medium and the paper is passed at a rate of 2.5 mm/sec between a pair of rollers as follows. The first roller is a hollow cylindrical iron roller of 40 mm diameter in which a 300 W-halogen lamp heater is stored and is disposed on the side of the transfer recording medium. The second roller disposed on the side of the paper comprises a similar iron roller of 40 mm diameter coated with a 0.5 mm-thick fluorine rubber layer. The two rollers are operated to exert a linear pressure of 4 kg/cm. In the measurement, the surface temperature of the first roller is measured by a temperature sensor, e.g., a thermistor, while controlling the halogen lamp heater to provide a prescribed temperature. At a time of 4 seconds after the laminate is passed through the two rollers, the transfer recording medium is peeled off the paper moved horizontally at a peeling angle of about 90° and at a rate equal to the conveying speed of the rollers, so that it is observed whether the transfer recording layer has been transferred onto the paper. The operation is continued while gradually raising the surface temperature of the first roller (at a rate of 10° C./min or less), and the minimum temperature at which the transfer starts to occur effectively (as identified by saturation of a transferred image density) is identified as the transfer initiation temperature of the transfer recording medium or the transfer recording layer.

In the above, the change in transfer characteristic has been explained as it is represented by a charge in glass transition temperature Tg, softening temperature Ts or melting temperature Tm. However, the recording medium according to the present invention may be sufficient if it changes its viscous state or penetration characteristic to the transfer-receiving medium in order to provide a recorded image through the following transfer step, so that it may be applicable even if a clear change in Tg, Ts or Tm as described above does not occur.

The combination of plural kinds of energies for producing a transferable image may suitably be light and heat or an energy convertible into heat selected from electric, ultrasonic and pressure in view of energy efficiency.

Next, formation of a multi-color image by the above recording method will be explained.

FIGS. 2A–2D are schematic partial sectional views showing a relationship between a transfer recording medium and a thermal head according to the present invention. In this embodiment, a heat energy modulated according to a recording signal is applied in combination with a light energy selected depending on the color of an image forming element of which the transfer characteristic is intended to be changed. Herein, "modulation" is an operation of changing a position to which the energy is applied corresponding to a given image signal, and "in combination" covers a case where the light energy and the heat energy are applied simultaneously as well as a case where the light energy and the heat energy are applied separately.

A transfer recording medium 1 shown in FIGS. 2A–2D comprises a transfer recording layer 1a disposed on a base film 1b. The transfer recording layer 1a is formed as a layer of distributed particulate image forming elements. Respective image forming elements show different color tones. In the embodiment shown in FIGS. 2A–2D, for example, each image forming element contains any one colorant selected from magenta (M), cyan (C) and yellow (Y). The colorants to be contained in the image forming elements, however, are not restricted to magenta, cyan and yellow, but may be colorants of any color depending on an intended use. Each image forming element contains in addition to a colorant, a functional or sensitive component, of which the transfer characteristic changes when light and heat energies are applied thereto. The image forming elements may be formed on the substrate 1b together with a binder or by heat-melting the above components.

The functional component in the image forming elements has a wavelength dependency depending on the colorant contained. More specifically, an image forming element (M) containing a magenta colorant causes polymerization to be hardened or cured when a heat flux and a light beam with a wavelength (M) are applied thereto. Similarly, an image forming element (C) containing a cyan colorant and an image forming element (Y) containing a yellow colorant respectively cause polymerization to be hardened when a heat and a light beam with a wavelength $\lambda(C)$ and heat, and a light beam with a wavelength $\lambda(Y)$ and heat, respectively, are applied thereto. A cured or hardened image forming element does not cause decrease in viscosity even when heated in a subsequent transfer step, so that it is not transferred to a transfer-receiving medium. The heat and light are applied corresponding to an information signal to be recorded.

In this way, the transfer recording medium 1 is superposed on a thermal head 14, and light is illuminated so as to cover the entire heat generation region of the thermal head 14. The wavelengths of the illumination light are so selected sequentially as to react on image forming elements (M), (C) and (Y) to be illuminated. For example, if image forming elements (M), (C) and (Y) to be illuminated are colored in any one of magenta, cyan and yellow, light beams having a wavelength $\lambda(M)$, $\lambda(C)$ and $\lambda(Y)$, respectively, are successively irradiated.

More specifically, while the transfer recording medium is illuminated with a light beam having a wavelength $\lambda(M)$, resistance heating elements 14b and 14c, for example, of the thermal head are caused to generate heat. As a result, among the image forming elements (M) containing a magenta colorant, those applied with the heat and the light beam with a wavelength $\lambda(M)$ are cured as shown by hatching in FIG. 2A (in FIG. 2B, et seq., the cured elements are also indicated by hatching).

Figure 2B:
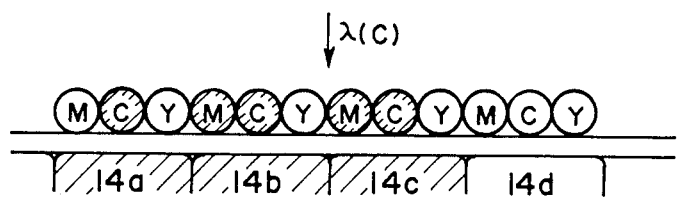
Figure 2C:
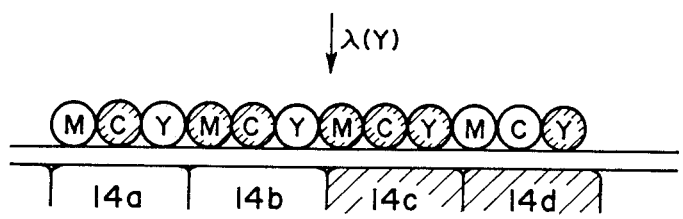
Figure 2D:
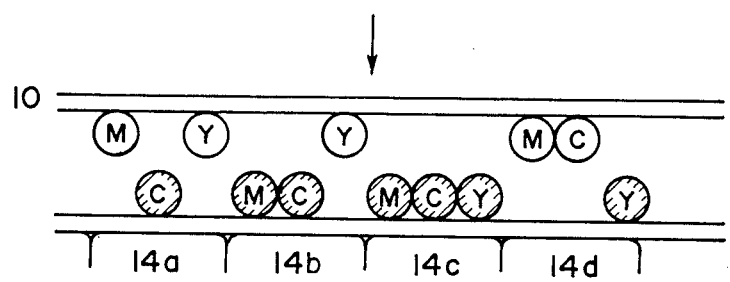

Then, as shown in FIG. 2B, while the transfer recording layer 1a is illuminated with a light beam with a wavelength $\lambda(C)$, resistance heating elements 14a, 14b and 14c are caused to generate heat, whereby among the image forming elements containing a cyan colorant, those applied with the heat and the light beam with a wavelength $\lambda(C)$ are cured. Further, as shown in FIG. 3C while the light flux with wavelength $\lambda(Y)$ is provided, resistance heating elements 14c and 14d are caused to generate heat, whereby among the image forming elements (Y), those applied with the heat and the light beam with a wavelength (Y) are cured to finally leave a transferable image formed of non-cured image forming elements in the transfer recording layer 1a. The transferable image is then transferred to a transfer-receiving medium 10 in a subsequent transfer step as shown in FIG. 2D.

In the transfer step, the transfer recording medium on which the transferable image has been formed is caused to contact the transfer-receiving medium 10 through the faces and heat is applied from the transfer recording medium side or the transfer-receiving medium 10 side, whereby the transferable image is selectively transferred to the transfer-receiving medium 10 to form a visible image thereon. Accordingly, the heating temperature in the transfer step is so determined in connection with the change in transfer characteristics that the transferable image is selectively transferred. Further, in order to effectively carry out the transfer, it is also effective to apply a pressure simultaneously. The pressurization is particularly effective when a transfer-receiving medium having a low surface smoothness is used. Further, where the physical property controlling a transfer characteristic is a viscosity at room temperature, the pressurization alone is sufficient to effect the transfer.

The heating in the transfer step is suitable for producing a durable multi-color image with a stability and an excellent storability.

In the above embodiment explained with reference to FIGS. 2A to 2D, the entire area of the thermal head 14 is illuminated with light while resistance heating elements of the thermal head 14 are selectively energized. On the contrary, while a certain area of the transfer recording medium are uniformly heated, e.g., by energizing all the resistance heating elements of the thermal head 14 shown in FIGS. 2A–2D, light illumination may be effected selectively or imagewise to form a similar multi-color image. More specifically, light energy having a wavelength modulated according to a recording signal and selected depending on the color of an image forming element of which the transfer characteristic is intended to be changed, is imparted along with heat energy.

As already described hereinabove, the functional component required for constituting the transfer recording layer of the transfer recording medium according to the present invention comprises at least a polymerizing component of a monomer, oligomer or prepolymer having an unsaturated double bond (ethylenic unsaturation), and a photo-initiator.

The photo-initiator may preferably be a radical initiator such as an azo compound, organic sulfur compound, carbonyl compound, or halogen compound. More specifically, examples of the photo-initiator may include: carbonyl compounds, such as benzophenone, benzyl, benzoin ethyl ether, and 4-N,N-dimethylamino-4'-methoxy-benzophenone; organic sulfur compounds, such as dibutyl sulfide, benzyl disulfide, and decyl phenyl sulfide; peroxides, such as di-tertbutyl peroxide, and benzoyl peroxide; halogen compounds, such as carbon tetrachloride, silver bromide, and 2-naphthalenesulfonyl chloride; and nitrogen compounds, such as azobisisobutylonitrile and benzenediazonium chloride.

Examples of the monomer, oligomer or prepolymer having an unsaturated double bond may include: urethane acrylates and urethane methacrylates having a urethane bond obtained by poly-addition of polyisocyanates (reacted in advance with polyols in advance as desired) and alcohols or amines having an unsaturated double bond; epoxy (meth)acrylates or polyester (meth)acrylates obtained by addition reaction of epoxy resin and acrylic acid or methacrylic acid; spin acrylates and polyether acrylates. Other compounds may also be used in the present invention.

Examples of the prepolymer may further include those containing a main chain of, e.g., polyalkyl, polyether, polyester or polyurethane and a side chain having thereon a reactive group capable of causing polymerization or crosslinking represented by acrylic group, methacrylic group, cinnamoyl group cinnamylideneacetyl group, furylacroyl group, and cinnamic acid ester group. Other prepolymers may also be used in the present invention.

It is desirable that the above-mentioned monomer, oligomer or prepolymer provides a solid composition at room temperature when mixed with a photo-initiator.

The functional component may preferably be contained in a proportion of 20–95 wt. %, and the photo-initiator therein may preferably be contained in a proportion of 0.001–20 wt. %, respectively with respect to the transfer recording layer.

The transfer recording layer may further contain a binder component in addition to the functional component. The binder component may be a known polymer. However, the characteristics of the transfer recording layer can be improved by adjusting physical properties of the binder component.

Recorded images of a high contrast can be obtained by using a thermoplastic polymer having a glass transition temperature (Tg) of 30° C. or above. Further, the use of a thermoplastic polymer having a weight-average molecular weight of $5 \times 10^4$ or more provides clear recorded images at a high sensitivity and a high transfer rate.

If a polymer is contained as a binder component in the transfer recording layer, the monomer, oligomer or prepolymer is when polymerized, entangled with the binder polymer to a high extent, whereby a larger change in transfer characteristic is attained compared with a case where the monomer, oligomer or prepolymer is used alone. If a thermoplastic polymer having a glass transition temperature of below 30° C. is used, however, the binder component itself has a strong adhesiveness in the transfer step so that the change in transfer characteristic caused by the polymerization becomes small. Further, when the glass transition temperature is 30° C. or higher, the molecular movement of the functional component in the transfer recording layer is restricted by the binder at room temperature to lower the sensitivity at room temperature, which provides a larger contrast in sensitivity with that obtained under heating. For this reason, the binder component should preferably have a glass transition temperature of 30° C. or higher, particularly 50° C. or higher. On the other hand, the use of a binder component having a glass transition temperature exceeding 150° C. is not desirable because it requires a higher energy for transfer.

It is preferred that the thermoplastic polymer has a weight-average molecular weight of $5 \times 10^4$ or larger, particularly $1 \times 10^5$ or larger. This is because a high molecular weight of the binder polymer provides a large change in transfer characteristic at a less quantity of illumination under heating as by a thermal head for formation of a transferable image, thus affording a high-sensitivity recording. Further, a molecular weight of below $5 \times 10^4$ lowers the film-formability of the transfer recording layer, thus lowering the transfer rate.

Such a thermoplastic binder polymer having a Tg of 30° C. or higher and a weight-average molecular weight of $5 \times 10^4$ or larger may preferably be contained in a proportion of 5–70 wt. %, particularly 5–40 wt. %, in the transfer recording layer.

If the binder component having a Tg of 30° C. or higher is contained too much, the transfer initiation temperature of the transfer recording layer becomes too high. On the other hand, less than 5 wt. % of the binder component does not provide a substantial effect thereof.

Examples of the thermoplastic polymer for providing the binder component having a Tg of 30° C. or higher and a weight-average molecular weight of $5 \times 10^4$ or higher may include: acrylic resins, such as polymethylmethacrylate, polyethylmethacrylate, and polyphenylmethacrylate; vinyl resins, such as polystyrene, poly-α-methylstyrene, styrene-acrylonitrile copolymer, and polyvinyl chloride; cellulose derivatives such as cellulose cyanurate, cellulose acetate, cellulose nitrate, and cellulose acetate butyrate; polycarbonate, and polyvinyl formal. In addition, chlorinated resins, such as chlorinated rubber, chlorinated polyethylene, and chlorinated polypropylene having an increased degree of chlorination to have a Tg of 30° C. or above, may also be used.

In order to increase the transfer rate of the transfer recording layer, it is preferred to use a thermoplastic polymer as a binder component having a weight-average molecular weight (Mw) of $5 \times 10^4$ or larger, particularly $1 \times 10^5$ or larger, and a molecular weight distribution weight-average molecular weight/number-average molecular weight) of 5 or below. A large molecular weight distribution means that the thermoplastic polymer contains a large proportion of low molecular weight components, thus providing a lower film-formability to lower the sensitivity and transfer rate of the transfer recording layer.

Such a thermoplastic polymer having a molecular weight distribution of 5 or below may also be preferably contained in a proportion of 5-70 wt. %, particularly 5-40 wt. %, of the transfer recording layer alone or together with the above mentioned thermoplastic polymer binder component.

It is also preferred to use a reactive thermoplastic polymer having an acryloyl group or methacryloyl group as a binder component in order to provide the transfer recording medium with a higher sensitivity.

The reactive polymer may also preferably have a weight-average molecular weight of $5 \times 10^4$ or larger, particularly $1 \times 10^5$ or larger Further, the reactive polymer may also have a double bond content in the range of 0.5-5 mg-equivalent/g. If the double bond content exceeds 5 mg-eq./g, the resultant recording layer may be improved in sensitivity but can change its transfer characteristic even under storage condition free of heat energy provision, thus being problematic in storability. On the other hand, a double bond content of below 0.5 mg-eq./g does not provide a substantial effect of the reactive binder component.

The reactive polymer binder component may also be preferably contained in a proportion of 5-70 wt. %, particularly 5-40 wt. %, of the transfer recording layer alone or in combination with another type of binder component as described above.

Examples of the reactive polymer binder component may include: reaction products through dehydrogen chloride of acid chlorides as by reaction of a polymer containing a methacrylic acid unit or acrylic acid unit in its molecular chain with acrylic acid chloride or methacrylic acid chloride, or reaction of a polymer containing an acrylic acid chloride or methacrylic acid chloride unit in its molecular structure with acrylic acid or methacrylic acid; reaction products through dehydration reaction of a polymer containing an acrylic acid unit or methacrylic acid unit in its molecular chain with acrylic acid or methacrylic acid; and reaction products through reaction of a polymer having a glycidyl acrylate or glycidyl methacrylate unit with acrylic acid or methacrylic acid. The reactive polymer having an acryloyl or methacryloyl group may be in the form of a copolymer with a suitable co-monomer, such as styrene, or an acrylic ester type monomer, such as methyl methacrylate or ethyl methacrylate.

The coloring component or colorant contained in the recording layer is a component to provide an optically recognizable image and may be appropriately selected from various pigments and dyes. Specific examples of the colorant include: inorganic pigments such as carbon black, lead yellow, molybdenum red, and red iron oxide; organic pigments such as Hansa Yellow, Benzidine Yellow, Brilliant Carmine 6B, Lake Red C, Permanent Red F5R, Phthalocyanine Blue, Victoria Blue Lake, and Fast Sky Blue; leuco dyes, and phthalocyanine dyes. The colorant may preferably be used in a proportion of 0.1-30 wt. parts per 100 wt. parts of the total amount of the functional component and the binder component.

The transfer recording medium according to the present invention may be formed by preparing a coating liquid by mixing or dispersing the above-mentioned components appropriately selected in a solvent as desired, and applying the coating liquid on a support to form a transfer recording layer.

The support may be composed of polyester, polycarbonate, triacetylcellulose, nylon, polyimide, polyethylene terephthalate, or metal such as aluminum. The support may be in any form of film, sheet, drum or sphere.

When the transfer recording layer is formed as a single coating layer, it is also effective to cover the recording layer with a film of polyethylene or polypropylene and remove the film after the formation of a transferable image in order to prevent the prohibition by oxygen in the atmosphere causing a sensitivity decrease of the functional component. Further, if the functional component is provided in the form of particles and coated with a polymer having a low oxygen-permeability, the sensitivity decrease can be prevented and an improved image resolution can be attained. Further, a transfer recording medium adapted to color recording (as shown in FIGS. 2A-2D) may be prepared by preparing a plurality of compositions comprising different colorants showing different colors and functional components sensitive to different wavelength regions corresponding to the colorants, respectively, micro-encapsulating the compositions for each color to form image forming elements, and carrying the image forming elements at random on the support.

Figure 5:
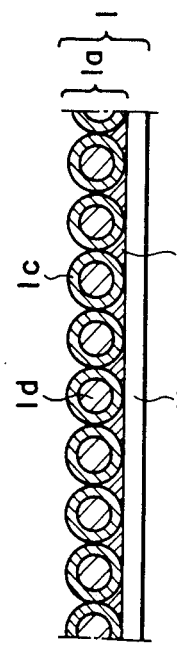
FIG. 5 is a schematic sectional view of a transfer recording medium for color-recording according to the present invention which comprises microcapsules containing a transfer recording material and carried on a support film.

More specifically, when image forming elements are in the form of microcapsules as shown in FIG. 5, the above mentioned compositions for the transfer recording layer are contained as cores $1d$ and encapsulated by a wall $1c$. On the other hand, the wall of the microcapsules may for example be formed of a material including gelatine, gum arabic, cellulosic resins such as ethyl cellulose, and nitrocellulose, polymers such as urea-formaldehyde resin, polyamides, polyesters, polyurethane, polycarbonate, maleic anhydride copolymers, polyvinylidene chloride, polyvinyl chloride, polyethylene, polystyrene, and polyethylene terephthalate.

The recording layer may preferably be formed in a thickness of 1-20 $\mu$, particularly 3-10 $\mu$. When the recording layer comprises particulate image forming elements including those in the form of microcapsules, it is preferred that the image forming elements have a particle size of 1-20 $\mu$, particularly 3-15 $\mu$. The image forming elements may preferably have a particle size distribution in the range of within ±50 %, particularly within ±20%, from the number-average particle size thereof. In case where the image forming elements are in the form of microcapsules, the shell thickness may preferably be 0.1-2.0 $\mu$, particularly 0.1-0.5 $\mu$.

Microencapsulation may be effected in any of the known methods, such as simple coacervation, complex coacervation, interfacial polymerization, in-situ polymerization, interfacial precipitation, phase separation, spray drying, gaseous-phase suspension coating, and mechano-chemical process.

In order to constitute the transfer recording medium according to the present invention into one adapted for use in multi-color image formation, the image forming elements containing different colorants may preferably have sensitivities to different wavelengths. As described hereinbefore, when the transfer recording layer is composed of a number (n) of colors of image forming elements, the image forming elements should preferably contain n types of functional components allotted to respective colors and each providing an abruptly changing reaction velocity when irradiated with a particular wavelength of light. These functional components in combination of n kinds are respectively contained in the image forming elements which are distributed to form a transfer recording layer. Examples of such a combination include, as a combination for a two-color recording system, one comprising:

a photo-initiator sensitive to about 400–500 nm, such as:

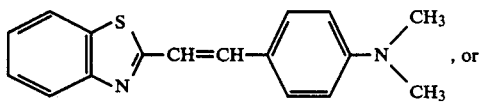

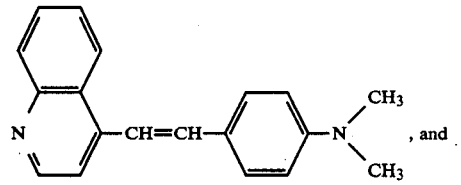

a photo-initiator sensitive to about 480–600 nm, such as:

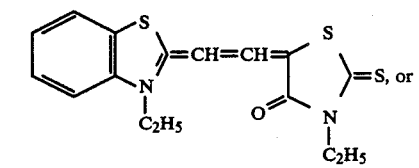

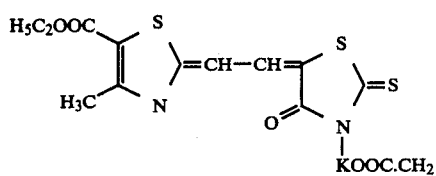

In this case, the sensitivity regions of the above two types of photo-initiators overlap each other in the region of 480–500 nm, but this is a low sensitivity region to both types of photo-initiators. Thus, they can be almost completely separated from each other, if necessary, by using appropriate light sources.

Sensitivity separation adapted for three color image forming element system may be provided by using an azo compound having a sensitivity to 340–400 nm or a halogen compound having a sensitivity to 300–400 nm in combination with the above photo-initiators, so that a full-color recording system may be developed.

Further, as a combination of photo-initiators, one of ⓐ 2-chlorothioxanthone/ethyl p-dimethylaminobenzoate, and ⓑ dichlorobenzophenone/ethyl p-dimethylaminobenzoate, may also be used. Light sources of ⓐ a fluorescent light having a peak wavelength of 390 nm and ⓑ a fluorescent light having a peak wavelength of 313 nm may be used in combination with the above combination of the photo-initiators. In order to provide the same degree of reaction (i.e., the same transfer density level), the required illumination energy level is assumed to be 1 (standard) for a combination ⓐ - ⓐ, 4 (times) for ⓐ - ⓑ, 1.1 for ⓑ - ⓑ, and 5 for ⓑ - ⓐ. As a result, if the light source ⓐ is used at the illumination energy level of 1 and the light source ⓑ is used at the illumination energy level of 1.1, the photo-initiator systems ⓐ and ⓑ can be separately activated so as to provide substantially the same reaction degree.

Further, even in a case where the functional components contained in the image forming elements have substantially the same spectral sensitivity or wavelength dependency, the respective image forming elements can have different spectral sensitivities due to different filter effects of colorants contained therein. For example, a blue colorant transmits and reflects wavelengths of about 400–500 nm for blue light and absorbs the region of 500–700 nm for green to red light. Accordingly, an image forming element containing a blue colorant has a sensitivity to blue light. For the same reason, an image forming element containing a red colorant has a sensitivity to red light. Thus, even if image forming elements contain a functional component sensitive to a blue-red spectral range, they can have separate sensitivities because of the colorants contained therein.

In the transfer recording medium used in the present invention, it is possible that the radical reactivity of the transfer recording layer is suppressed because of oxygen in the air. In order to obviate this difficulty, it is preferred to provide an oxygen-shielding layer by applying an aqueous polyvinyl alcohol solution containing a small amount of a surfactant on the transfer recording layer. The oxygen-shielding layer may be removed after the latent image formation by washing with water. In case of image forming elements in the form of microcapsules, it is possible to have the walls show a function of the oxygen-shielding layer.

The color transfer recording medium used in the present invention may for example be produced in the following manner.

The various components forming the transfer recording layer such as the functional component, binder component, stabilizer, colorant, etc., may be melt-mixed and coated on a substrate such as a polyimide film by means of an application, etc., to form a transfer recording medium. In case where the transfer recording layer is formed of image forming elements of multi-colors, for example, the above components may be mixed and formed into minute image forming elements by spray drying, etc., for respective colors, and the resultant image forming elements of respective colors are sufficiently mixed with a binder such as a polyester resin in a solvent such as methyl ethyl ketone and ethylene glycol diacetate and coated by a solvent-coating method onto a substrate such as a polyimide film, followed by drying, e.g., at 80° C. for 3 minutes to remove the solvent to form a transfer recording layer. Thus, a desired transfer recording medium may be obtained.

Alternatively, it is also possible to apply a coating binder of an adhesive such as that of polyvinyl alcohol (PVA), epoxy-type, polyvinylpyrrolidone, polyacrylamide, polyester-type, urethane resin-type, acrylic-type, urethane-acrylic-type, or ethylene-vinyl acetate copolymer-type, and then to distribute image forming elements on the coating binder layer. The binder may preferably be applied in a thickness of 0.1–1 μ.

In a case where the image forming elements are in the form of microcapsules, they may be bound to a substrate by a method similar to one as described above with reference to the minute or particulate image forming elements.

It is also possible to attach the particulate image forming elements onto the support electrostatically. In this case, the particulate image forming elements or the support or both may be corona-charged or triboelectrically charged, followed by attachment. It is further possible to provide the surfaces of the image forming elements and the support, respectively, with functional groups and then to chemically bind the image forming elements to the support.

As described above, in the transfer recording medium according to the present invention, the transfer recording layer contains a thermoplastic polymer as a binder component to increase the sensitivity of the recording layer, and the sensitivity at room temperature is suppressed by providing the thermoplastic polymer with a glass transition temperature of 30° C. or higher, whereby clear recorded images can be formed at a high contrast. Further, by setting the weight-average molecular weight of the thermoplastic polymer to $5 \times 10^4$ or more, a higher sensitivity and a better transfer rate are accomplished.

Hereinbelow, the present invention will be explained by way of Examples.

EXAMPLE 1

TABLE 1

| Category | Component | wt. % |
|---|---|---|
| Polymerizing component | Reaction product between 4,4'-dicyclohexylmethane diisocyanate and 2-hydroxyethyl acrylate | 67 |
| Binder component | Polyethyl methacrylate (Tg = 60° C., Mw = 35 × 10$^4$, mfd. by General Science Corporation K.K.) | 23 |
| Photo-initiator | 2-Chlorothioxanthone (Tokyo Kasei K.K.) | 1 |
| | Ethyl dimethylaminobenzoate (Tokyo Kasei K.K.) | 2 |
| Colorant | Carbon black | 7 |

The components shown in the above Table 1 were dissolved in dichloromethane solvent and applied in a thickness of 4 μm onto a 6 μm-thick polyethylene terephthalate (PET) film by solvent coating. The coating film was further coated with an aqueous solution of polyvinyl alcohol (PVA, Mw=1200) to form a 10 μm-thick oxygen-shielding layer, thereby to obtain a transfer recording medium according to the present invention, which is hereinafter sometimes referred to as a "sample".

The sample thus prepared was placed on a hot plate heated to a prescribed temperature and illuminated for a prescribed period with ultraviolet rays from a 2KW-high-pressure mercury lamp disposed opposite to the sample. After the ultraviolet illumination, the sample was placed for 3 minutes on a hot plate at 100° C. so as to accelerate and uniformize the reaction, and then the PVA oxygen-shielding layer was removed by washing with water.

Then, plain paper having a surface smoothness of 10–30 sec was superposed on the transfer recording layer of the sample, and the resultant laminate was introduced into a separation-transfer unit of a recording apparatus as shown in FIG. 4 and conveyed between a heat roller 8 and a pinch roller 9. The heat roller 8 was an aluminum roller having a 300 W-heater inside thereof and covered with a 2 mm-thick silicone rubber layer. The surface temperature of the heat roller 8 was controlled at 150° C. by the heater. The pinch roller 9 was one made of silicone rubber (having a hardness of 50° according to measurement by JIS rubber hardness meter) and controlled to exert a pressure of 1–1.5 kg/cm$^2$.

From the laminate sample thus treated, the support PET film was peeled off to examine whether or not the illuminated portion of the recording layer was transferred to the plain paper.

The above operation was repeated while changing the temperature at the time of illumination and the time for illumination variously, thereby to obtain a critical illumination time required to increase the transfer temperature of the illuminated portion to 150° C. or above. The results are summarized as a curve Ex. 1 in FIG. 9 in terms of a relation between the reciprocal of the illumination temperature (T) and the reciprocal of the above-mentioned critical illumination time ($t_{ph}$) for providing a transfer initiation temperature of 150° C. The reciprocal ($t_{ph}^{-1}$) of the critical illumination time is defined as "sensitivity".

Figure 9:
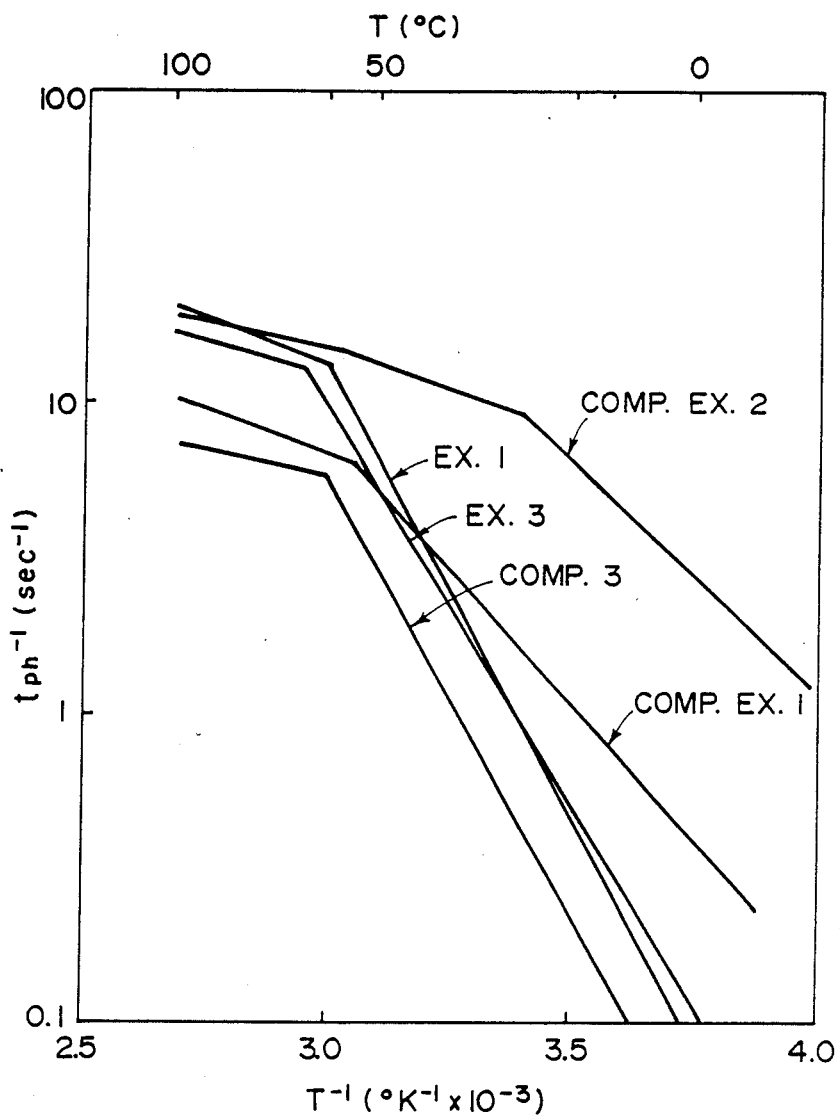
FIG. 9 is a graph showing a relation between the reciprocal of temperature of a transfer recording medium at the time of illumination and the reciprocal of light quantity required for providing a transfer temperature of 150° C. or higher to the transfer recording medium.

The curve Ex. 1 in FIG. 9 shows that the transfer recording medium according to the present invention showed a low sensitivity to illumination under no heating but showed a high sensitivity to illumination under heating, thus possessing very excellent storage stability and sensitivity in combination.

Separately, the sample prepared in the above manner was wound up in a roll and set in the transfer image-formation unit of an apparatus as shown in FIG. 3A.

The thermal head 4 was one of a line type of 8 dots/mm—A4 size having a row of resistance heating elements at its edge portion. The thermal head 4 was disposed so as to contact the base film side of the transfer medium 1 and in such a manner that the transfer medium 1 was pressed to the heating elements due to a tension applied to the transfer medium. Opposite to the thermal head 4 was disposed a high pressure mercury lamp 3 of about 2 KW.

Then, the thermal head 4 was energized while being controlled based on image signals. In this example, the parts of the transfer recording layer 1a increased glass transition point, whereby a negative type of recording was effected. More specifically, the thermal head 4 was controlled in such a manner that it was not energized in response to a mark signal (black) but was energized in response to a non-mark signal (white) to generate heat at a current energy of 0.8 W/dot×25 msec. In this way, while effecting uniform illumination with a high pressure mercury lamp, the thermal head was driven under control based on image signals at a repetition cycle of 50 msec/line, in phase with which the transfer recording medium was conveyed by means of a stepping motor and a driving rubber roller.

Then, the PVA film was removed and the transfer recording medium was superposed on a transfer-receiving paper. The resultant laminate was then introduced into the separation-transfer unit of the apparatus shown in FIG. 3A and passed between the heating rollers, followed by separation of the PET support, whereby a high quality image was formed with a good fixation characteristic on the transfer-receiving paper.

EXAMPLE 2

TABLE 2

| Sample No. | 1 | 2 | 3 | 4 | 5 | 6 | 7 | 8 |
|---|---|---|---|---|---|---|---|---|
| | (wt. %) | | | | | | | |
| Polymerizing component | 87 | 85 | 80 | 67 | 50 | 40 | 20 | 10 |
| Binder component | 3 | 5 | 10 | 23 | 40 | 50 | 70 | 80 |
| Photo-initiator | 3 | 3 | 3 | 3 | 3 | 3 | 3 | 3 |
| Colorant | 7 | 7 | 7 | 7 | 7 | 7 | 7 | 7 |

Eight samples (Samples 1–8) were prepared by repeating the procedure of Example 1 except that the quantities of the respective components were changed as shown in the above Table 2.

For these samples, the transfer initiation temperature when none of light and heat energies was supplied (represented by curve F in FIG. 10) and the critical illumination time for providing a transfer initiation temperature of 150° C. when illumination was effected under heating at 100° C. (represented by curve E in FIG. 10) were measured. The results are represented by the curves F and E in FIG. 10.

Figure 10:
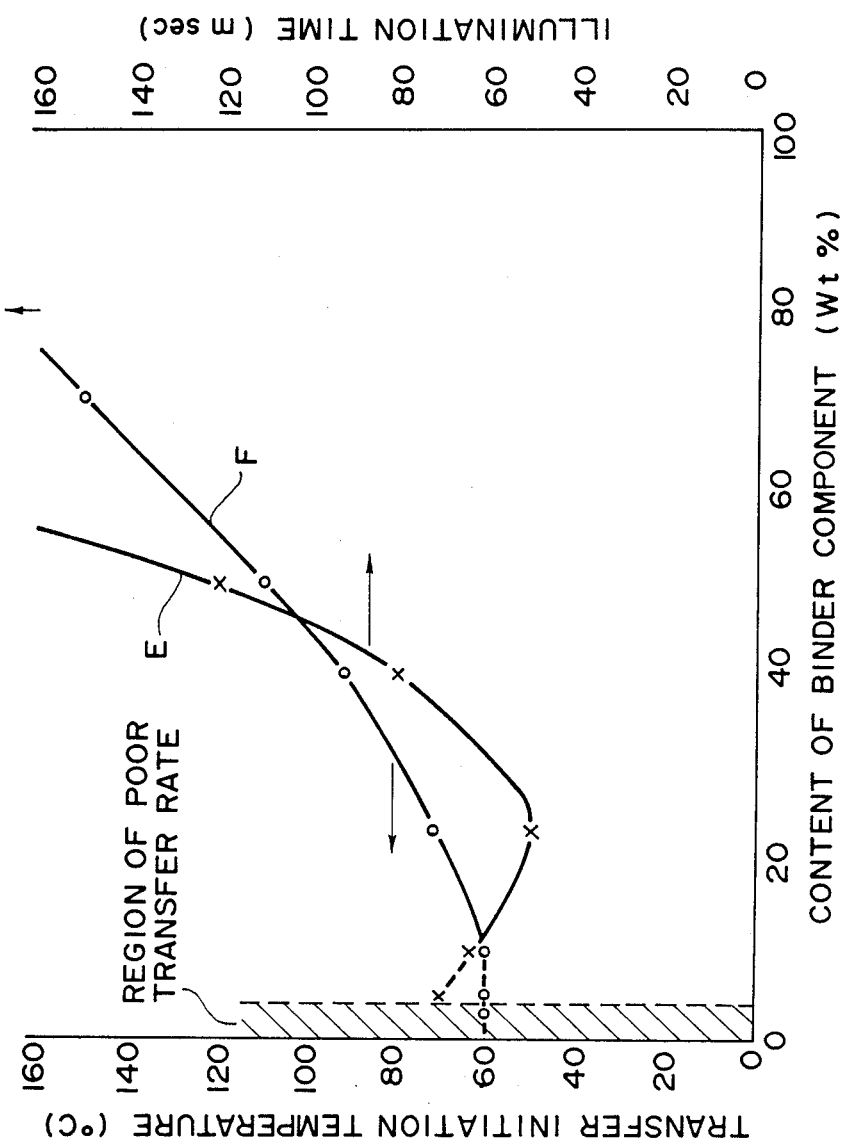
FIG. 10 is a graph showing a relation between the content of a binder component and the transfer initiation temperature.

As shown in FIG. 10, the transfer initiation temperature under no provision of light or heat energy increased as the binder content increased to exceed 150° C. around 70 wt. % of the binder content. On the other hand, less than 5 wt. % of the binder component provided a poor transfer rate and also a low image density.

FIG. 10 further shows that the binder content of 5–70 wt. %, particularly 5–40 wt. %, provided a recording medium of a high sensitivity.

EXAMPLE 3

TABLE 3

| Category | Component | wt. % |
| --- | --- | --- |
| Polymerizing component | Reaction product between 4,4'-dicyclohexylmethane diisocyanate and 2-hydroxyethyl acrylate | 67 |
| Binder component | Polyvinyl chloride (Tg = 85° C., Mw = 10 × 10$^4$, mfd. by General Science Corporation K.K.) | 23 |
| Photo-initiator | 2-Chlorothioxanthone (Tokyo Kasei K.K.) | 1 |
| | Ethyl dimethylaminobenzoate (Tokyo Kasei K.K.) | 2 |
| Colorant | Carbon black | 7 |

A sample was prepared in the same manner as in Example 1 except for using the components shown in above Table 3. The sample was evaluated with respect to the relation between the reciprocal of the illumination temperature and the sensitivity. The results are also shown in FIG. 2 as Ex. 3, representing good heat—or temperature-dependency of the sensitivity. The sample of this Example was also satisfactory in image-formation.

EXAMPLE 4

TABLE 4

| Category | Component | wt. % |
| --- | --- | --- |
| Polymerizing component | Reaction product between 4,4'-dicyclohexylmethane diisocyanate and 2-hydroxyethyl acrylate | 67 |
| Binder component | Polyethyl methacrylate (Tg = 60° C., Mw = 35 × 10$^4$, mfd. by General Science Corporation K.K.) | 23 |
| Photo-initiator | 2-Chlorothioxanthone (Tokyo Kasei K.K.) | 1 |
| | Ethyl dimethylaminobenzoate (Tokyo Kasei K.K.) | 2 |
| Colorant | Diaresin Yellow (Mitsubishi Kasei K.K.) | 7 |

TABLE 5

| Category | Component | wt. % |
| --- | --- | --- |
| Polymerizing component | Reaction product between 4,4'-dicyclohexylmethane diisocyanate and 2-hydroxyethyl acrylate | 67 |
| Binder component | Polyethyl methacrylate (Tg = 60° C., Mw = 35 × 10$^4$, mfd. by General Science Coporation K.K.) | 23 |
| Photo-initiator | Irgacure 184 (Ciba-Geigy Corp.) | 1 |
| | Ethyl dimethylaminobenzoate (Tokyo Kasei K.K.) | 2 |
| Colorant | Diaresin Red K (Mitsubishi Kasei K.K.) | 7 |

TABLE 5-continued

The compositions shown in the above Tables 4 and 5 were respectively microencapsulated in the following manner.

Each of the compositions shown in Tables 4 and 5 in a quantity of 10 parts was mixed with 20 parts of methylene chloride. The mixture was mixed with a solution of a cationic or nonionic surfactant having an HLB value of at least 10 and 1 g of gelatine in 200 ml of water, and the resultant mixture was stirred by means of a homomixer at an elevated temperature of 60° C. to form an emulsion containing oil droplets with an average particle size of 26 μm.

The emulsion was further stirred at 60° C. for 30 min to evaporate the methylene chloride to provide an average particle size of 10 μm. A solution of 1 g of gum arabic in 20 ml of water was added thereto, and the system was gradually cooled with addition of an NH$_4$OH aqueous solution (ammoniacal water) to a pH of above 11, thereby form a slurry of microcapsules. Then, 1.0 ml of a 20% aqueous solution of glutaraldehyde was slowly added to harden the capsule walls.

Then, the slurry was subjected to solid-liquid separation by a Nutsche funnel to recover the capsules, which were then dried under vacuum at 35° C. for 10 hours to obtain image forming elements in the form of microcapsules.

The thus prepared two types of image forming elements each having an average particle size of 10 μm were mixed in equal amounts.

Separately, a 6 μm-thick polyethylene terephthalate film 1b was coated with a 5% aqueous solution of polyvinyl alcohol as an adhesive to which a surfactant had been added in a proportion of several drops per 100 cc. Then, the above prepared mixture of image forming elements were dispersed on the support 1 coated with the adhesive 1f as shown in FIG. 5 and dried in 1 hour in an environment of 80° C. to form a transfer recording layer 1a, thereby to obtain a sample of the transfer recording medium 1.

The transfer recording medium thus prepared was wound up in a roll and set in an apparatus as shown in FIG. 3A. In the apparatus shown in FIG. 3A, the light source 3 included a fluorescent lamp 3b having a spectral peak wavelength of 335 nm (FL. 10A70E35, mfd. by Toshiba K.K.) and a fluorescent lamp 3c having a spectral peak wavelength of 390 nm (FL. 10A70E39, mfd. by Toshiba K.K.) corresponding to the spectral absorption characteristics of the two types of image forming elements as shown in FIG. 3B. The lamps 3b and 3c were disposed in parallel so as to illuminate the sample surface through a 1 mm-wide slit respectively.

The transfer recording layer had a property of increasing its softening temperature to lose a transferability to the record paper 10 when it was provided with light rays a prescribed wavelength range and heat. For this reason, as shown in the timing chart of FIG. 6, for the purpose of red color recording, a current was supplied for 25 msec not to heating elements corresponding to an image signal of "red"but to heating elements corresponding to an image signal of "white" (the color of the paper 10), and the fluorescent lamp 3b was turned on with a time lag of 5 msec to effect uniform illumination. The illumination time at this time was 45 msec.

Next, for yellow color recording, from a point of time 50 msec after the termination of the above illumination, i.e., from the point 100 msec after the commencement of the energization of the heating elements, a current was supplied for 25 msec not to heating elements corresponding to an image signal of "yellow" but to heating elements corresponding to an image signal of "white", and the fluorescent lamp 3c was turned on 5 msec thereafter to effect uniform illumination. The illumination time was equally 45 msec.

In the above described manner, the thermal head 4 was energized under control based on image signals of yellow, red and white to form a negative image in the transfer recording layer, while the transfer recording medium 1 was conveyed in synchronism with the operation in a repetition cycle of 200 msec/line. After the above-mentioned image was formed in this way, the transfer recording medium 1 was sent to the transfer section as shown in FIG. 4, where a recording paper 10 was superposed onto the image bearing face of the transfer medium, and after heating under pressure, the transfer medium was separated to leave a transferred image of two colors of yellow and red on the recording paper 10. Thus, two-color recording was effected in one shot.

Figure 7:
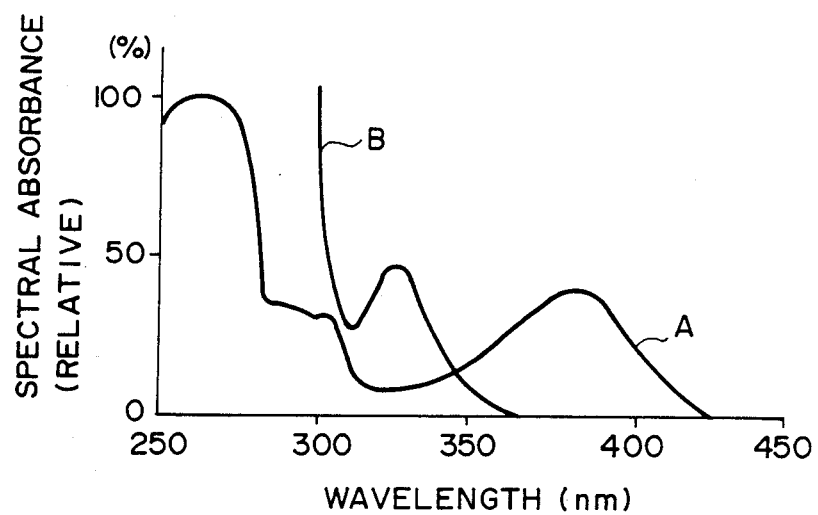
FIG. 7 shows the spectral absorption characteristics of photo-initiators contained in two kinds of image forming elements in Example 4.
Figure 8:
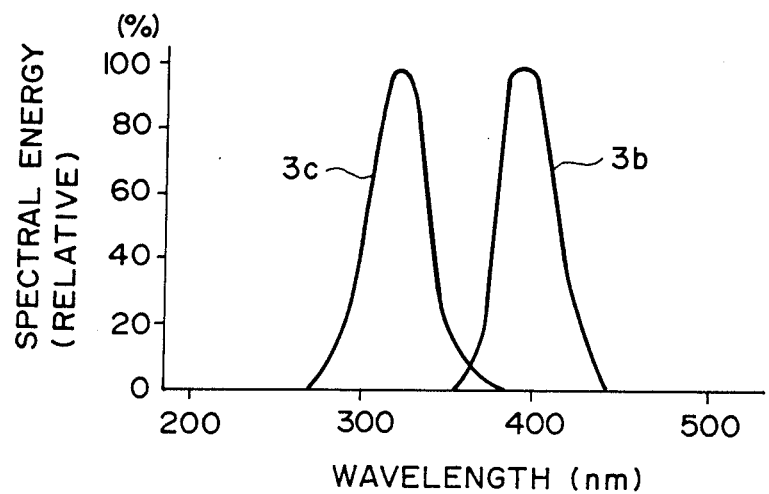
FIG. 8 shows spectral energies of two fluorescent lamps used as light sources corresponding to two kinds of image forming elements in Example 4.

FIG. 7 shows an absorption spectrum A of the photoinitiator given in Table 5 and an absorption spectrum B of the photoinitiator given in Table 4. FIG. 8 shows the spectral energy distributions of the two types of fluorescent lamps used in this Example.

COMPARATIVE EXAMPLE 1

TABLE 6

| Category | Component | wt. % |
|---|---|---|
| Polymerizing component | Reaction product between 4,4'-dicyclohexylmethane diisocyanate and 2-hydroxyethyl acrylate | 88 |
| Photo-initiator | 2-Chlorothioxanthone (Tokyo Kasei K.K.) | 2 |
| | Ethyl dimethylaminobenzoate (Tokyo Kasei K.K.) | 3 |
| Colorant | Carbon black | 7 |

A sample was prepared in the same manner as in Example 1 except for using the components shown in the above Table 6. The sample was evaluated with respect to the relation between the reciprocal of the illumination temperature and the sensitivity. The results are also shown in FIG. 9. Image formation could be effected by using the sample, but the sensitivity and the transfer rate of the sample were lower than that of Example 1.

COMPARATIVE EXAMPLE 2

TABLE 7

| Category | Component | wt. % |
|---|---|---|
| Polymerizing component | Reaction product between 4,4'-dicyclohexylmethane diisocyanate and 2-hydroxyethyl acrylate | 67 |
| Binder component | Poly-n-butyl methacrylate (Tg = 25° C., Mw = 35 × 10⁴) | 23 |
| Photo-initiator | 2-Chlorothioxanthone (Tokyo Kasei K.K.) | 1 |
| | Ethyl dimethylaminobenzoate (Tokyo Kasei K.K.) | 2 |
| Colorant | Carbon black | 7 |

A sample was prepared in the same manner as in Example 1 except for using the components shown in the above Table 7. The sample was evaluated with respect to the relation between the reciprocal of the illumination temperature and the sensitivity. The results are also shown in FIG. 9. The sample of this example did not show sufficiently large temperature-dependency of the sensitivity and resulted in white dropping in image at the time of image formation.

COMPARATIVE EXAMPLE 3

TABLE 8

| Category | Component | wt. % |
|---|---|---|
| Polymerizing component | Reaction product between 4,4'-dicyclohexylmethane diisocyanate and 2-hydroxyethyl acrylate | 67 |
| Binder component | Polyethyl methacrylate (Tg = 60° C., Mw = 3 × 10⁴, Elvacite 2043, mfd. by E. I. DuPont) | 23 |
| Photo-initiator | 2-Chlorothioxanthone (Tokyo Kasei K.K.) | 1 |
| | Ethyl dimethylaminobenzoate (Tokyo Kasei K.K.) | 2 |
| Colorant | Carbon black | 7 |

A sample was prepared in the same manner as in Example 1 except for using the components shown in the above Table 8. The sample was evaluated with respect to the relation between the reciprocal of the illumination temperature and the sensitivity. The results are also shown in FIG. 9.

As shown in FIG. 9, the binder component used in this Example had a low weight-average molecular weight, so that the sample showed a sensitivity which was ⅓ of that in Example 1. Image formation was carried out a slower driving rate of 150 msec/line, but the transfer rate and the image density were lower than in Example 1.

EXAMPLE 5

TABLE 9

| Category | Component | wt. % |
|---|---|---|
| Polymerizing component | Reaction product between cyclohexylene diisocyanate and 2-hydroxyethyl acrylate | 67 |
| Binder component | Polymethyl methacrylate (PMMA) (Mw = 55 × 10⁴, Mw/Mn = 3.1, BR-108, mfd. by Mitsubishi Rayon K.K.) | 23 |
| Photo-initiator | 2-Chlorothioxanthone | 1 |
| | Ethyl dimethylaminobenzoate | 2 |
| Colorant | Carbon black | 7 |

A sample was prepared in the same manner as in Example 1 except for using the components shown in the above Table 9.

The sample thus prepared was placed on a hot plate heated to a prescribed temperature and illuminated for a prescribed period by a 2 KW-high pressure mercury lamp disposed opposite to the sample.

The above operation was repeated while changing the illumination time. As a result, for the samples illuminated for 70 msec or shorter, the illuminated portions were also transferred. On the other hand, for the samples illuminated for 80 msec or longer, the illuminated portions were not transferred at all, whereby it was found that the sample recording medium of this Example could effect image formation for an illumination time of 80 msec or longer.

The transfer rate of the above sample was measured by comparing the optical density of the recording layer as formed on the PET film with the optical density of the recording layer transferred onto plain paper by means of RD-914 optical densitometer (available from McBeth Co.), whereby the transfer rate was evaluated to be almost 100% in terms of the density ratio.

Separately, the sample prepared in the above manner was wound up in a roll and set in an apparatus comprising a combination of the units shown in FIGS. 3A and 4.

Image formation was effected by providing light and heat energies to the sample in the same manner as in Example 1, followed by removal of the PVA film. The sample thus treated was superposed on a record paper, and the laminate was passed between the heating rollers, followed by separation of the PET support film, whereby a high quality image was formed with a good fixation characteristic on the record paper.

EXAMPLE 6

A number of samples were prepared by repeating the procedure of Example 5 except that the proportions between the polymer component and the binder component as shown in the following Table 10. By using these samples, the minimum exposure time (illumination time) required for providing the non-transferable state to the recording layer and the transfer rate were measured for each sample. The results are also shown in the following Table 10.

TABLE 10

| Polymerizing component (wt. %) | 87 | 80 | 50 | 30 | 10 |
|---|---|---|---|---|---|
| Binder component (wt. %) | 3 | 10 | 40 | 60 | 80 |
| Minimum exposure time (msec) | 60 | 80 | 85 | 125 | 165 |
| Transfer rate (%) | 60 | 100 | 100 | 100 | 100 |

EXAMPLE 7

TABLE 11

| Category | Component | wt. % |
|---|---|---|
| Polymerizing component | Reaction product between 4,4'-dicyclohexylmethane diisocyanate and 2-hydroxyethyl acrylate | 67 |
| Binder component | Polymethyl methacrylate (BR-108, Mitsubishi Rayon K.K.; Mw = 55 × 10$^4$, Mw/Mn = 3.1) | 23 |
| Photo-initiator | Irgacure 184 (Ciba-Geigy Corp.) | 1 |
| | Ethyl dimethylaminobenzoate | 2 |
| Colorant | Diaresin Red K (Mitsubishi Kasei Kogyo K.K.) | 7 |

TABLE 12

| Category | Component | wt. % |
|---|---|---|
| Polymerizing component | Reaction product between 4,4'-dicyclohexylmethane diisocyanate and 2-hydroxyethyl acrylate | 67 |
| Binder component | Polymethyl methacrylate (BR-108, Mitsubishi Rayon K.K.) | 23 |
| Photo-initiator | 2-Chlorothioxanthone | 1 |
| | Ethyl dimethylaminobenzoate | 2 |
| Colorant | Diaresin Yellow | 7 |

The compositions shown in the above Tables 11 and 12 were respectively microencapsulated in the same manner as in Example 4 to form image-forming elements in the form of microcapsules.

The thus prepared two types of image-forming elements each having an average particle size of 10 μm were mixed in equal amounts and distributed as shown in FIG. 5 on a 6 μm-thick PET film coated with an adhesive 1f in the same manner as in Example 4 to form a transfer recording medium 1.

Figure 6:
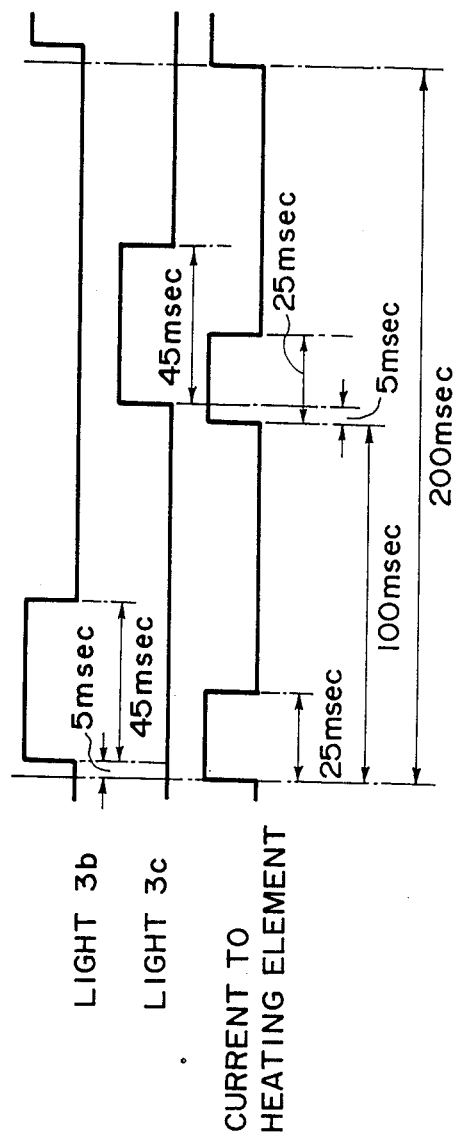
FIG. 6 is a timing chart for signals supplied to a thermal head and fluorescent lamps for two-color recording in Example 4.

The transfer recording medium thus prepared was wound up in a roll and set in an apparatus as shown in FIG. 3A and subjected to image formation according to the timing chart shown in FIG. 6 in the same manner as in Example 4.

Then, the transfer recording medium provided with a transferable image was then sent to the transfer unit shown in FIG. 4, where the transfer medium was superposed on a recording paper 10 and passed together between the heating rollers under pressure, followed by peeling of the support PET film to leave a transferred image of two colors of yellow and red on the recording paper 10. Thus, two-color recording was effected in one shot.

EXAMPLE 8

Example 5 was repeated except for replacing the binder component with PMMA having an Mw=40×10$^4$ and an Mw/Mn ratio of 5.3, whereby the minimum exposure time required for providing the illuminated portion with a non-transferable state was measured to be 120 msec, thus showing a lower sensitivity than Example 5. Further, the transfer rate of the samples illuminate for 110 msec or below and causing transfer was about 75%, which was lower than Example 5.

EXAMPLE 9

Reactive unsaturated polymer binder components were prepared as shown in Table 13 hereinbelow and explained as follows.

Methyl methacrylate and methacrylic acid were co-polymerized under the conditions shown in Table 13 the products were respectively recovered by precipitation in cyclohexane.

10 g of each product was dissolved in 200 cc of THF (tetrahydrofuran), to which 1 g of tetramethylammonium chloride was added. Then, 10 g of acrylic acid chloride was added, and the mixture was subjected to reaction at 40° C. for 3 hours.

Each reaction liquid thus obtained was poured in cyclohexane and the product was recovered by precipitation, to obtain polymers No. 1–4 shown in Table 13.

The double-bond equivalent of the respective polymers calculated from the charged amount of the methacrylic acid are also shown in Table 13. This is because it had been confirmed that substantially all the methacrylic acid was reacted with the acrylic acid chloride as a result of infrared analysis.

TABLE 13

| Polymer No. | | 1 | 2 | 3 | 4 |
|---|---|---|---|---|---|
| Methyl methacrylate | (mol) | 0.95 | 0.9 | 0.7 | 0.5 |
| Methacrylic acid | (mol) | 0.05 | 0.1 | 0.3 | 0.5 |
| Amount of solvent (THF) | (g) | 100 | 100 | 100 | 100 |
| Amount of initiator (AIBN) | (g) | 0.4 | 0.4 | 0.4 | 0.4 |
| Polymerization temperature | (°C.) | 60 | 60 | 60 | 60 |
| Polymerization | (hr) | 24 | 24 | 24 | 24 |

TABLE 13-continued

| Polymer No. | 1 | 2 | 3 | 4 |
|---|---|---|---|---|
| period |  |  |  |  |
| Double bond-equivalent (mg-eq./g) | 0.56 | 1.1 | 3.1 | 4.7 |

Each polymer was fractionated by using a series of THF-cyclohexane fractionating liquids to obtain sample polymer Nos. 1-1 to 4-1 as shown in Table 14 set forth hereinbelow together with their weight-average molecular weights and degrees of dispersion.

A sample transfer recording medium was prepared by using each of the polymers 1-1 to 4-1 as the binder component and otherwise in the same manner as in Example 1.

Each sample transfer recording medium was placed on a hot plate heated to a prescribed temperature and illuminated from a 2KW-high pressure mercury lamp disposed opposite to the transfer recording layer of the sample, followed by examination of the transfer in the same manner as in Example 1. The results are also shown in Table 14 below.

Further, in order to evaluate the contrast each transfer recording medium was illuminated under no heating and then transferred between the heating rollers in the same manner as described above to examine whether or not transfer was caused.

The above operations were repeated while changing the exposure or illumination time variously to evaluate the contrast of each sample medium. The results are also shown in Table 14. Herein the contrast of a sample transfer recording medium is defined as the quotient of the maximum exposure time in which a medium can retain its transferability under no heating by the minimum exposure time in which the medium acquires no-transferability under heating.

TABLE 14

|  | Sample No. | | | |
|---|---|---|---|---|
|  | 1-1 | 2-1 | 3-1 | 4-1 |
| Weight-average molecular weight Mw | $1.0 \times 10^5$ | $1.2 \times 10^5$ | $1.4 \times 10^5$ | $1.5 \times 10^5$ |
| Degree of dispersion Mw/Mn | 3.8 | 3.5 | 3.3 | 3.2 |
| Double-bond equivalent (mg-eq./g) | 0.56 | 1.1 | 3.1 | 4.7 |
| Minimum exposure time*[1] | 80 ms | 80 ms | 60 ms | 50 ms |
| Maximum exposure time*[2] | 1 sec | 1 sec | 850 ms | 800 ms |
| Contrast | 13 | 13 | 14 | 16 |

*[1] For providing a non-transferable state on illumination under heating at 100° C.
*[2] For retaining its transferability or illumination under no heating, i.e., at 25° C.

EXAMPLE 10

TABLE 15

| Category | Component | wt. % |
|---|---|---|
| Polymerizing component | Tris(2-acryloxy isocyanurate) (Aronix M-315, mfd. by Toa Gosei K.K.) | 50 |
| Binder component | Sample polymer No. 4-1 | 40 |
| Photo-initiator | Irgacure 184 (Ciba-Geigy Corp.) | 1 |
|  | Ethyl dimethylaminobenzoate (Tokyo Kasei K.K.) | 2 |
| Colorant | Diaresin Red K (Mitsubishi Kasei K.K.) | 7 |

TABLE 16

| Category | Component | wt. % |
|---|---|---|
| Polymerizing component | Tris(2-acryloxy isocyanurate) (Aronix M-315, mfd. by Toa Gosei | 50 |

TABLE 16-continued

| Category | Component | wt. % |
|---|---|---|
| Binder component | Sample polymer No. 4-1 | 40 |
| Photo-initiator | 2-Chlorothioxan (Tokyo Kasei K.K.) | 1 |
|  | Ethyl dimethylaminobenzoate (Tokyo Kasei K.K.) | 2 |
| Colorant | Diaresin Yellow (Mitsubishi Kasei K.K.) | 7 |

The compositions shown in the above Tables 15 and 16 were respectively microencapsulated in the same manner as in Example 4 to form image-forming elements in the form of microcapsules.

The thus prepared two types of image-forming elements each having an average particle size of 10 μm were mixed in equal amounts and distributed as shown in FIG. 5 on a 6 μm-thick PET film coated with an adhesive 1f in the same manner as in Example 4 to form a transfer recording medium 1.

The transfer recording medium thus prepared was wound up in a roll and set in an apparatus as shown in FIG. 3A and subjected to image formation according to the timing chart shown in FIG. 6 in the same manner as in Example 4.

Then, the transfer recording medium provided with a transferable image was then sent to the transfer unit shown in FIG. 4, where the transfer medium was superposed on a recording paper 10 and passed together between the heating rollers under pressure, followed by peeling of the support PET film to leave a transferred image of two colors of yellow and red on the recording paper 10. Thus, two-color recording was effected in one shot.

What is claimed is:
1. A transfer recording medium comprising a support and a transfer recording layer formed thereon; said transfer recording layer irreversibly changing its transferability when simultaneously provided with light and heat energy and the transfer recording layer comprising a colorant, a binder component and a functional component sensitive to said light and heat energy, the functional component comprising (i) a photo-initiator and (ii) a polymerizing component selected from the group consisting of monomers, oligomers and prepolymers, each having an unsaturated double bond, said functional component being a solid composition at room temperature; the binder component comprises a thermoplastic polymer having a glass transition temperature of 30° C. or higher in a weight-average molecular weight of $5 \times 10^4$ or larger; and the thermoplastic polymer is contained in a proportion of –70 weight percent of the transfer recording layer.

2. A transfer recording medium according to claim 1, wherein said thermoplastic polymer has a glass transition temperature of 50° C. or higher.

3. A transfer recording medium according to claim 1, wherein said thermoplastic polymer has a weight-average molecular weight of $1 \times 10^5$ or larger.

4. A transfer recording medium according to claim 1, wherein said thermoplastic polymer is contained in a proportion of 5–40 wt. % of the transfer recording layer.

5. A transfer recording medium according to claim 1, wherein said transfer recording layer comprises a distributed layer of image-forming elements each comprising the colorant, the binder component and the functional component.

6. A transfer recording medium according to claim 5, wherein said transfer recording layer comprises plural kinds of image-forming elements containing different photo-initiators having mutually different sensitive wavelength regions.

7. A transfer recording medium according to claim 1, wherein said transfer recording layer comprises a distributed layer of micro-capsules each having a core comprising the colorant, the binder and the functional component.

8. A transfer recording medium according to claim 7, wherein said transfer recording layer comprises plural kinds of microcapsules containing different photo-initiators having mutually different sensitive wavelength regions.

9. A transfer recording medium according to claim 1, wherein said thermoplastic polymer has a degree of molecular weight dispersion of 5 or below.

10. A transfer recording medium according to claim 1, wherein said thermoplastic polymer is one having an acryloyl group or a methacryloyl group.

11. A transfer recording medium according to claim 10, wherein said thermoplastic polymer has a double-bond equivalent of 0.5–5 mg eq./g.

* * * * *